(12) United States Patent
Kim et al.

(10) Patent No.: US 12,103,772 B2
(45) Date of Patent: Oct. 1, 2024

(54) WAFER STORAGE SYSTEM

(71) Applicant: SAMSUNG ELECTRONICS CO., LTD., Suwon-si (KR)

(72) Inventors: Minji Kim, Suwon-si (KR); Sangmin Kim, Hwaseong-si (KR); Youngwook Kim, Seoul (KR); Ginam Park, Incheon (KR); Chuljun Park, Seoul (KR); Sanga Bang, Hwaseong-si (KR); Yongjun Ahn, Suwon-si (KR); Sangkyung Lee, Hwaseong-si (KR); Hyunwoo Lee, Hwaseong-si (KR); Jeonghun Lim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 89 days.

(21) Appl. No.: 17/847,542

(22) Filed: Jun. 23, 2022

(65) Prior Publication Data

US 2023/0061872 A1   Mar. 2, 2023

(30) Foreign Application Priority Data

Aug. 30, 2021   (KR) .................. 10-2021-0114712

(51) Int. Cl.
*B65G 1/04* (2006.01)
*B65G 49/06* (2006.01)

(52) U.S. Cl.
CPC ......... *B65G 1/0478* (2013.01); *B65G 49/063* (2013.01); *B65G 2201/0297* (2013.01)

(58) Field of Classification Search
CPC ............... B65G 1/0478; B65G 49/063; B65G 2201/0297; B65G 1/0464;
(Continued)

(56) References Cited

U.S. PATENT DOCUMENTS 3,612,304 A * 10/1971 Troth ................... B65G 1/0428
414/284
8,047,762 B2 * 11/2011 Zimmerhackl ... H01L 21/67775
414/940
(Continued)

FOREIGN PATENT DOCUMENTS

DE   102013222900 A1 * 5/2015 ............... B08B 9/08
JP   2020-075819 A   5/2020
(Continued)

*Primary Examiner* — Gregory W Adams
(74) *Attorney, Agent, or Firm* — Muir Patent Law, PLLC (57) ABSTRACT

A wafer storage system includes a main rail, an overhead hoist transport (OHT) on the main rail, the OHT being configured to transfer at least one storage case with wafers, an interface port on at least one side of the main rail, an auxiliary rail on one side of the interface port, the auxiliary rail being parallel to the main rail, and the interface port being between the main rail and the auxiliary rail, an auxiliary transport on the auxiliary rail, the auxiliary transport being configured to move along the auxiliary rail and to move the at least one storage case, a storage shelf on at least one side of the auxiliary transport, the storage shelf being configured to store the at least one storage case, and a worktable on one side of the storage shelf, the storage shelf being between the worktable and the auxiliary transport.

15 Claims, 11 Drawing Sheets

(58) Field of Classification Search
CPC ........... H01L 21/67736; H01L 21/6773; H01L 21/67733; H01L 21/67769; Y10S 414/14
USPC ........................................................ 414/940
See application file for complete search history.

(56) References Cited

U.S. PATENT DOCUMENTS

| | | |
|---|---|---|
| 8,483,866 B2 | 7/2013 | Huang et al. |
| 8,622,682 B2 | 1/2014 | Murata et al. |
| 9,048,275 B2 * | 6/2015 | Murata ............. H01L 21/67379 |
| 9,169,066 B2 * | 10/2015 | Morikawa ................ B65G 1/02 |
| 9,385,019 B2 | 7/2016 | Fosnight et al. |
| 9,633,879 B2 | 4/2017 | Ito et al. |
| 10,453,724 B2 * | 10/2019 | Yoo .................... H01L 21/67769 |
| 10,625,938 B2 * | 4/2020 | Horii ...................... B65G 37/02 |
| 10,699,928 B2 | 6/2020 | Motoori |
| 2018/0211857 A1 | 7/2018 | Yoo et al. |
| 2019/0217873 A1 * | 7/2019 | Imahori .................... B66C 1/28 |
| 2020/0047998 A1 * | 2/2020 | Tanaka .............. H01L 21/67733 |
| 2020/0100437 A1 * | 4/2020 | Christiaens ............ A01G 18/62 |

FOREIGN PATENT DOCUMENTS

| | | |
|---|---|---|
| KR | 10-1340786 B1 | 12/2013 |
| KR | 10-2018-0002002 A | 1/2018 |

* cited by examiner

WAFER STORAGE SYSTEM

CROSS-REFERENCE TO RELATED APPLICATION

This application claims benefit of priority to Korean Patent Application No. 10-2021-0114712 filed on Aug. 30, 2021, in the Korean Intellectual Property Office, the disclosure of which is incorporated herein by reference in its entirety.

BACKGROUND

1. Field

The present disclosure relates to a wafer storage system.

2. Description of the Related Art

In line with an increase in semiconductor production and scaling of semiconductor processes, there is a trend for increasing the size of semiconductor manufacturing or processing factories. However, an increased size of semiconductor manufacturing or processing factories may require an increased storage space.

SUMMARY

According to an aspect of the present disclosure, a wafer storage system may include a main rail; an overhead hoist transport (OHT) traveling along the main rail and transferring a storage case in which a plurality of wafers are accommodated; an interface port disposed on at least one side of the main rail; an auxiliary rail disposed on one side of the interface port and disposed to be parallel to the main rail; an auxiliary transfer unit traveling along the auxiliary rail and moving the storage case; a storage shelf disposed on one side of at least the auxiliary transfer unit and storing the storage case; and a worktable disposed on one side of the storage shelf to allow an operator to perform maintenance and repair work, wherein the interface port is disposed between the auxiliary rail and the main rail, and the auxiliary rail guides movement of the auxiliary transfer unit.

According to another aspect of the present disclosure, a wafer storage system may include a main rail; an overhead hoist transport (OHT) on the main rail, the OHT being configured to transfer at least one storage case with wafers; an interface port on at least one side of the main rail; an auxiliary rail on one side of the interface port; an auxiliary transport on the auxiliary rail, the auxiliary transport being configured to move along the auxiliary rail; a storage shelf on at least one side of the auxiliary transport, the storage shelf being configured to store the at least one storage case, and the storage shelf having a first storage shelf on one side of the auxiliary transport, and a second storage shelf connected to the first storage shelf, the second storage shelf being below the auxiliary transport, and the auxiliary transport being configured to transfer the at least one storage case between the interface port and at least one of the first storage shelf and the second storage shelf; and a worktable on one side of the storage shelf.

BRIEF DESCRIPTION OF DRAWINGS

Features will become apparent to those of skill in the art by describing in detail exemplary embodiments with reference to the attached drawings, in which.

DETAILED DESCRIPTION

Hereinafter, example embodiments of the present disclosure will be described with reference to the accompanying drawings.

Figure 1:
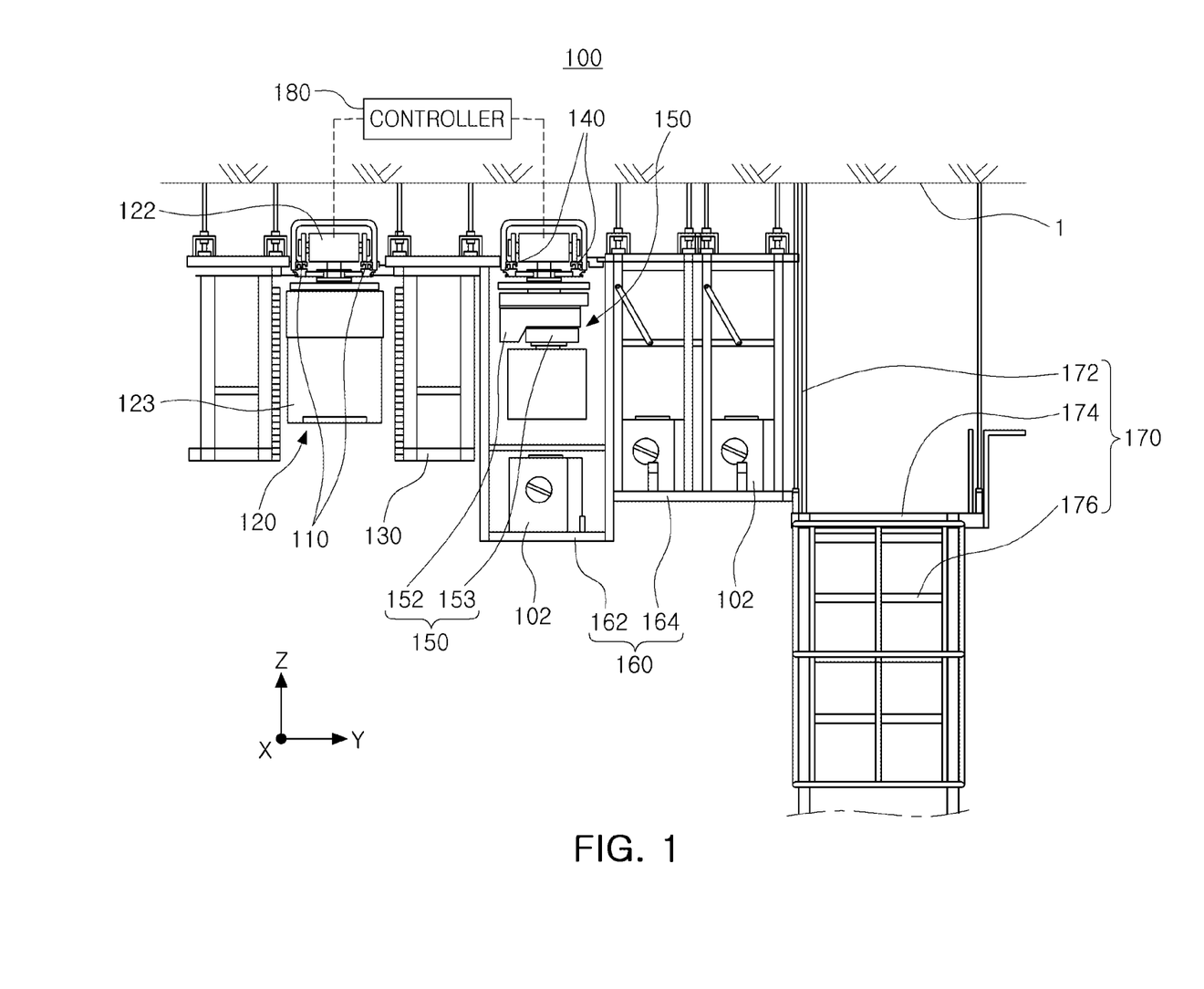
FIG. 1 is a schematic layout diagram of a wafer storage system according to an example embodiment.
Figure 2:
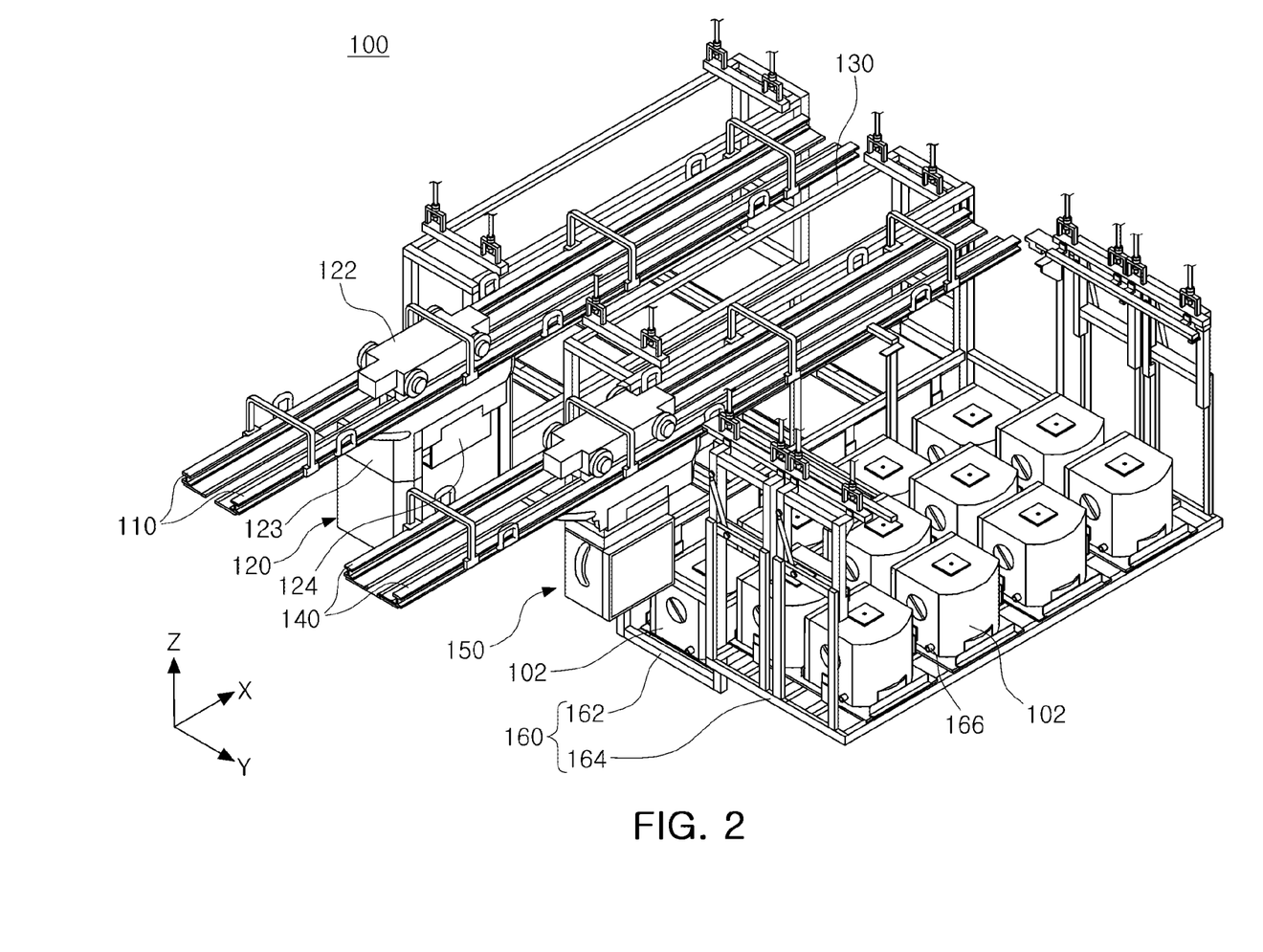
FIG. 2 is a schematic perspective view of a portion of a wafer storage system according to an example embodiment.

FIG. 1 is a view illustrating a wafer storage system according to an example embodiment, and FIG. 2 is a schematic perspective view illustrating a portion of a wafer storage system according to an example embodiment.

Referring to FIGS. 1 and 2, a wafer storage system 100 according to an example embodiment may include a main rail 110, an overhead hoist transport (OHT) 120, an interface port 130, an auxiliary rail 140, an auxiliary transfer unit 150, a storage shelf 160, and a worktable 170. Each of the main rail 110, the interface port 130, the auxiliary rail 140, the storage shelf 160, and the worktable 170 may be independently attached to a ceiling surface 1 of a semiconductor processing factory. The interface port 130, the auxiliary transfer unit 150, the storage shelf 160, and the worktable 170 may be sequentially disposed on one side or both sides of the OHT 120.

The main rail 110 may be fixedly installed on the ceiling surface 1 of the semiconductor processing factory. As an example, the main rail 110 may be disposed parallel to an X-axis of FIGS. 1-2. Accordingly, the OHT 120 may be moved in the X-axis direction. In another example, the main rail 110 may be disposed in various directions, e.g., the X-axis direction, a Y-axis direction, and a direction crossing the X-axis and the Y-axis of FIGS. 1-2. As such, the main rail 110 is installed in a region in which the auxiliary rail 140 is not disposed to guide movement of the OHT 120.

The OHT 120 may travel, e.g., move, on the main rail 110 and transfer a storage case 102, e.g., a front opening unified pod (FOUP), in which a plurality of wafers is accommodated. For example, the OHT 120 may include a traveling unit 122 attached to and traveling along the main rail 110 (e.g., in the X-axis direction), a main body 123 connected to the traveling unit 122, and a grip unit 124 (e.g., a gripper) installed in the main body 123 to slide (e.g., slide in and out of the main body 123 in the Y-axis direction) and move up and down (e.g., grip and release the storage case along the Z-axis direction). For example, the grip unit 124 may grip the storage case 102, and may move to an inner space of the main body 123 with the storage case 102, so the OHT 120 may move along the main rail 110 by the traveling unit 122 to transfer the storage case 102 to a predetermined position. Once the OHT 120 is moved to the predetermined position, the grip unit 124 gripping the storage case 102 may be drawn out from the main body 123, e.g., along the Y-axis direction, to put the storage case 102 down at the predetermined position, e.g., in the interface port 130. As such, the OHT 120 transports the storage case 102 within the semiconductor factory.

The interface port 130 may be disposed on at least one side of the main rail 110, e.g., the interface port 130 may be on a lateral side of the main rail 110. For example, the interface port 130 may extend in parallel along the long side of the main rail 110. As an example, the interface port 130 may be disposed on at least one side of a movement path of the OHT 120. Meanwhile, the interface port 130 serves to provide a space in which the storage case 102 is temporarily stored, e.g., after being transferred from the OHT 120. For example, the interface port 130 provides a space for temporarily storing the storage case 102 before the storage case 102 is transferred from the OHT 120 to the storage shelf 160 by the auxiliary transfer unit 150 or before the storage case 102, which has been transferred to the storage shelf 160 by the auxiliary transfer unit 150, is transferred back to the OHT 120.

Figure 3:
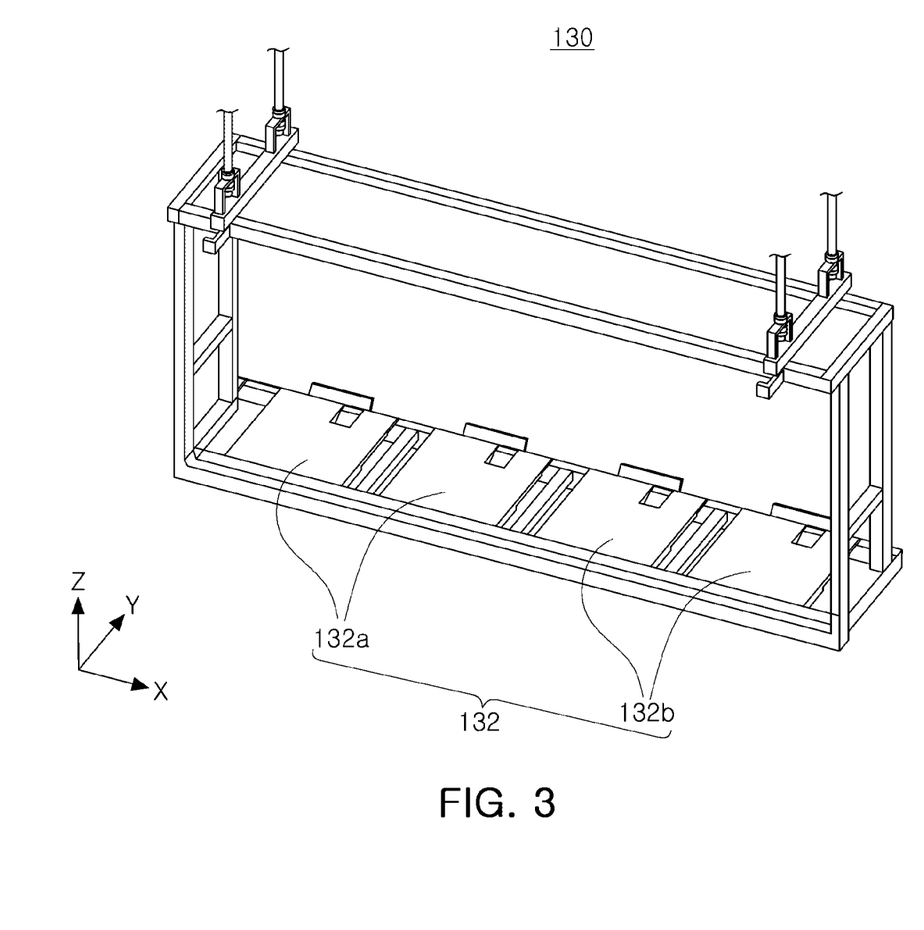
FIG. 3 is a perspective view of an interface port of a wafer storage system according to an example embodiment.

For example, as shown in detail in FIG. 3, the interface port 130 may have a hexahedral frame shape to provide a space in which a plurality of storage cases 102 (refer to FIG. 1) are accommodated. As illustrated in FIG. 3, the interface port 130 may include a seating plate 132 on which the storage case 102 is seated. For example, the seating plate 132 may include a first region 132a, in which the storage case 102 transferred by the OHT 120 is seated, and a second region 132b, in which the storage case 102 transferred by the auxiliary transfer unit 150 is seated. In addition, the seating plate 132 may have a plurality of recesses and holes to fix, e.g., stabilize or secure, the storage case 102 thereon.

The interface port 130 may be fixedly installed on the ceiling surface 1 (refer to FIG. 1) of the semiconductor factory, e.g., supports may extend from the upper corners of the interface port 130 to the ceiling surface 1. For example, as illustrated in FIG. 1, the interface port 130 is disposed on both sides of the OHT 120, e.g., the OHT 120 may be installed between two interface ports 130. In another example, a single interface port 130 may be disposed on only one side of the OHT 120.

As shown in detail in FIG. 2, the auxiliary rail 140 may be disposed in parallel to the main rail 110 and may be disposed in a partial region of a semiconductor factory. As an example, the auxiliary rail 140 may be fixedly installed on the ceiling surface 1 of the semiconductor factory. Meanwhile, the auxiliary rail 140 may be disposed on at least one side of the interface port 130, e.g., the interface port 130 may be between the main rail 110 and the auxiliary rail 140. For example, the auxiliary rail 140 may be disposed between the interface port 130 and the storage shelf 160. For example, as illustrated in FIG. 2, the auxiliary rail 140 may have the same length as the main rail 110, i.e., in the X-axis direction. In another example, the auxiliary rail 140 may be disposed so as not to interfere with the main rail 110 and may have a length shorter than the main rail 110 in the X-axis direction.

Figure 4:
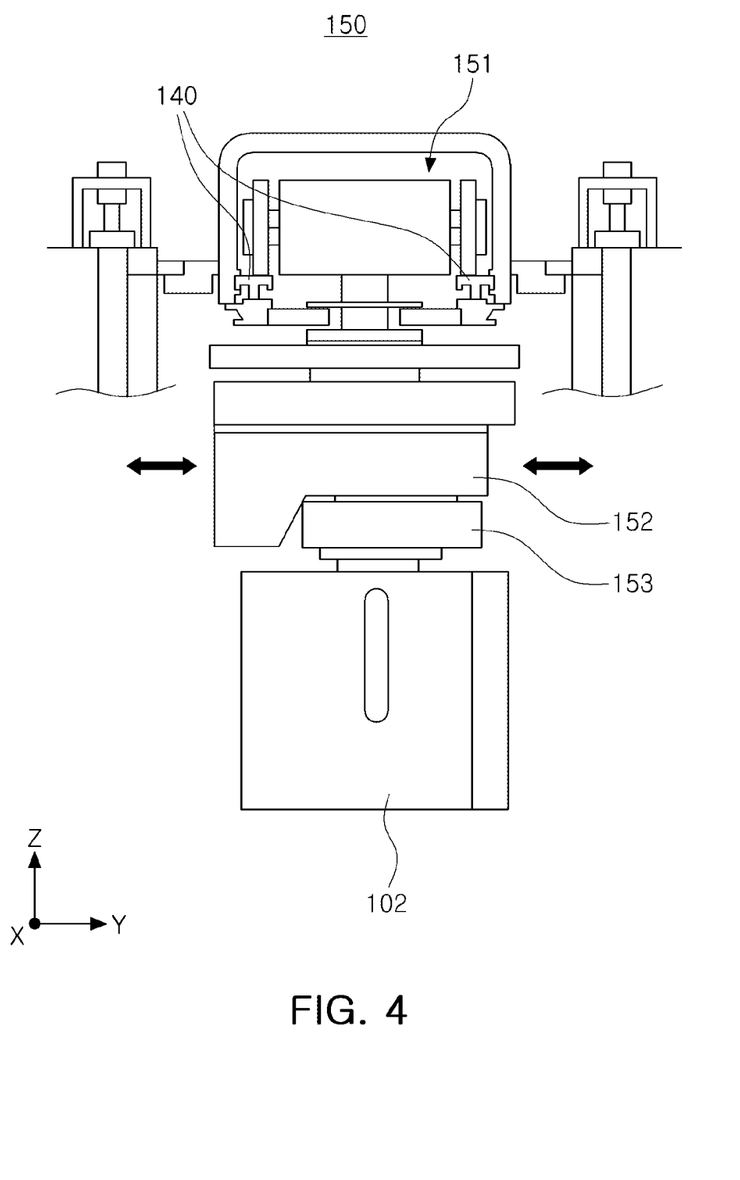
FIG. 4 is a front view of an auxiliary transfer unit of a wafer storage system according to an example embodiment.

The auxiliary transfer unit 150 may travel, e.g., move, on the auxiliary rail 140, e.g., along the X direction, to move the storage case 102. As an example, the auxiliary transfer unit 150 (i.e., an auxiliary transport) may transfer the storage case 102 from the interface port 130 to the storage shelf 160 or from the storage shelf 160 to the interface port 130. As shown in detail in FIG. 4, the auxiliary transfer unit 150 may include a traveling unit 151 traveling on the auxiliary rail 140, a slider 152 connected to the traveling unit 151 and slidably moveable in the Y-axis direction of FIGS. 2 and 4, and a grip unit 153, e.g., a gripper, installed on the slider 152 and gripping the storage case 102, while ascending and descending in the Z-axis direction of FIGS. 2 and 4.

For example, the auxiliary transfer unit 150 may move the storage case 102 transferred by the OHT 120 to the first region 132a of the interface port 130 to the storage shelf 160. In addition, the auxiliary transfer unit 150 may move the storage case 102 stored in the storage shelf 160 to the second region 132b of the interface port 130. For example, referring to FIG. 4, the traveling unit 151 may be attached to and move along the auxiliary rail 140, e.g., in the X direction, while the slider 152 and the grip unit 153 (attached to the traveling unit 151) may move with the traveling unit 151. At this time, the Y-axis directional movement of the storage case 102 (e.g., movement between the interface port 130 to the storage shelf 160) is performed by the slider 152 of the auxiliary transfer unit 150, and the Z-axis directional movement of the storage case 102 is performed by the grip unit 153 of the auxiliary transfer unit 150. In addition, the role of gripping the storage case 102 is also performed by the grip unit 153. As an example, the grip unit 153 is provided with a configuration that is moved to be spaced apart from others thereof or adjacent to others thereof to grip an upper end portion of the storage case 102.

The auxiliary transfer unit 150 and the OHT 120 may be movable, e.g., portions within each of the auxiliary transfer unit 150 and the OHT 120 may be moveable in the X-axis direction, Y-axis direction, and the Z-axis direction. A movable distance of the storage case 102 by the slider 152 in the Y-axis direction (the direction intersecting the auxiliary rail 140), e.g., movement between the interface port 130 and the storage shelf 160, may be longer than a movable distance of the storage case 102 by the OHT 120 in the Y-axis direction (the direction intersecting the main rail 110), e.g., movement between the OHT 120 and the interface port 130. For example, referring to FIG. 1, the slider 152 of the auxiliary transfer unit 150 may move the storage case 102 in the Y-axis direction from one side of the auxiliary rail 140 to the opposite side (e.g., between the interface port 130 and the storage shelf 160), while the grip unit 124 of the OHT 120 may move the storage case 102 in the Y-axis direction only to a single side of the main rail 110 (e.g., between the OHT 120 on the main rail 110 and the interface port 130).

The storage shelf 160 may be disposed on at least one side of the auxiliary transfer unit 150 and provides a storage space for storing the storage case 102. As an example, the storage shelf 160 may include a first storage shelf 164 disposed on one side of the auxiliary transfer unit 150 and a second storage shelf 162 connected to the first storage shelf 164 and disposed below the auxiliary transfer unit 150. For example, the first storage shelf 164 may be fixedly installed on the ceiling surface 1 of the semiconductor factory, e.g., the first storage shelf 164 may extend in the X-axis direction along a lateral sidewall of the auxiliary transfer unit 150, and the second storage shelf 162 may be fixedly installed on, e.g., a lateral sidewall of, the first storage shelf 164, e.g., the second storage shelf 162 may extend under a bottom of the auxiliary transfer unit 150 in the X-axis direction along a lateral sidewall of the first storage shelf 164 that faces the auxiliary transfer unit 150.

As illustrated in FIG. 2, the first storage shelf 164 may have a storage space in which a plurality of storage cases 102 is accommodated so as to have a plurality of rows and columns, and the second storage shelf 162 may have a storage space in which a plurality of storage cases 102 is accommodated so as to have a single column. For example, a plurality of storage cases 102 may be stored in the first storage shelf 164 in a plurality of rows in the X-axis direction and a plurality of columns in the Y-axis direction (e.g., in a two-directional matrix pattern), and a plurality of storage cases 102 may be stored in the second storage shelf 162 in a plurality of rows in the X-axis direction and one column in the Y-axis direction. For example, a width of the first storage shelf 164 may be at least twice larger than a width of the second storage shelf 162 along the Y-axis direction (e.g., due to the number of columns in the Y-axis directions). For example, a width of the second storage shelf 162 may equal at least a width of the auxiliary rail 140 in the Y-axis direction.

Figure 5:
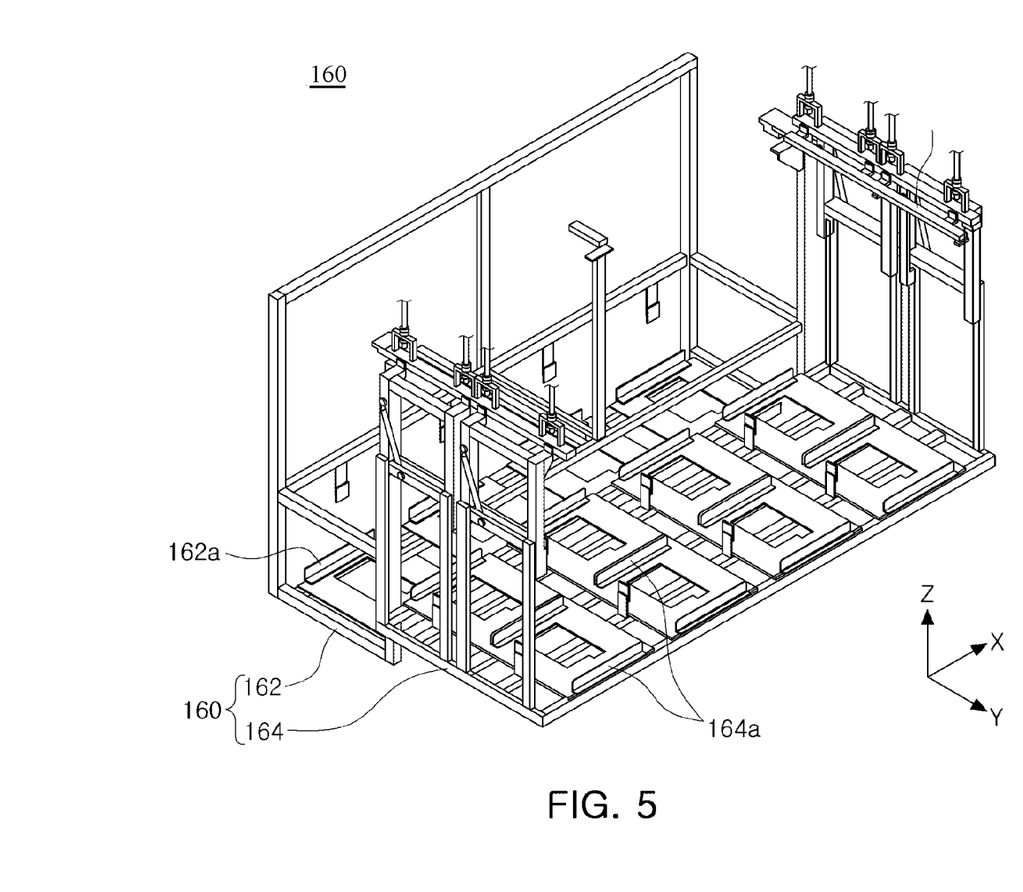
FIG. 5 is a perspective view of a storage shelf of a wafer storage system according to an example embodiment.

As illustrated in FIG. 5, the first storage shelf 164 may have a plurality of first projections 164a for preventing the storage cases 102 from being separated from the first storage shelf 164, and the second storage shelf 162 may also have a plurality of second protrusions 162a for preventing the storage cases 102 from being separated from the second storage shelf 162. For example, referring to FIG. 5, the first projections 164a and second protrusions 162a may extend from a bottom of each of the respective first and second storage shelves 164 and 162 toward the ceiling surface 1, and may have a shape surrounding a respective one of the storage cases 102. Further, at least the first storage shelf 164 may include an injection pipe 166 through which a purge gas (e.g., $N_2$ gas) is injected into the storage case 102 (refer to FIG. 2).

Figure 6:
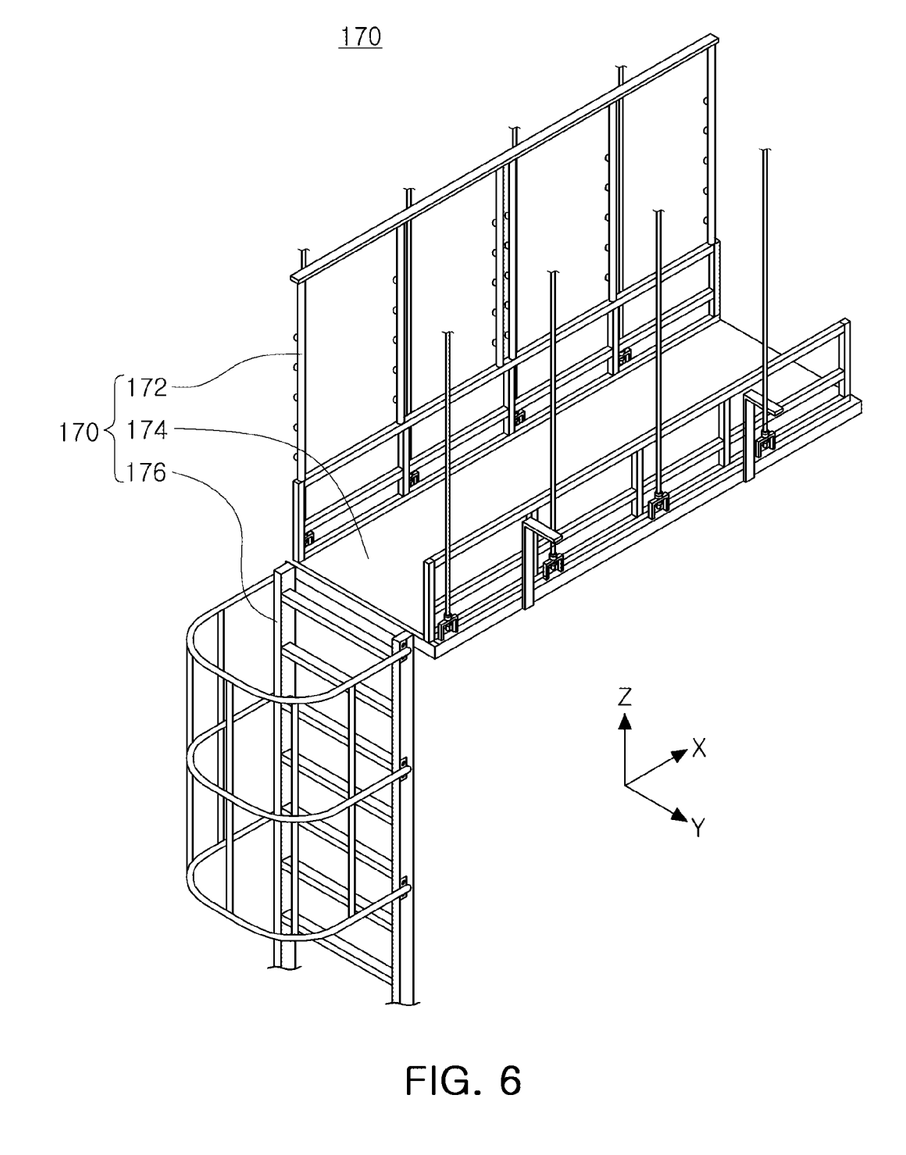
FIG. 6 is a perspective view of a worktable of a wafer storage system according to an example embodiment.

The worktable 170 is provided on one side of the storage shelf 160 to provide a work space for an operator to perform maintenance work, e.g., the storage shelf 160 may be between the worktable 170 and the auxiliary transfer unit 150. As shown in FIG. 6, the worktable 170 may include a frame 172 installed on the ceiling surface 1 (refer to FIG. 1) of the semiconductor factory, a plate 174 installed on the frame 172 and providing the work space of the operator, and a ladder 176 connected to the plate 174. In this manner, since the worktable 170 is provided on one side of the storage shelf 160, the operator may easily perform the maintenance operation of the storage shelf 160, e.g., while standing on the plate 174 during maintenance and repair work.

As further illustrated in FIG. 1, a controller 180 may be connected to the OHT 120 and the auxiliary transfer unit 150. The controller 180 may control movement of the OHT 120 and the auxiliary transfer unit 150. As an example, the controller 180 may be disposed adjacent to the auxiliary rail 140.

As described above, since storage cases 102 may be stored on the storage shelf 160 through the auxiliary transfer unit 150 moved along the auxiliary rail 140, a larger number of storage cases 102 may be stored. In other words, since the auxiliary rail 140 and the auxiliary transfer unit 150 may be installed utilizing a space not used in the semiconductor factory, e.g., a free space above a production facility, and the storage shelf 160 is disposed on one side and a lower side of the auxiliary transfer unit 150, a number of stored storage cases 102 may be increased, and a larger number of wafers may be stored.

Hereinafter, an operation of the wafer storage system 100 according to an example embodiment will be described with reference to FIGS. 7 to 11. FIGS. 7 to 11 are views illustrating an operation of the wafer storage system 100.

Figure 7:
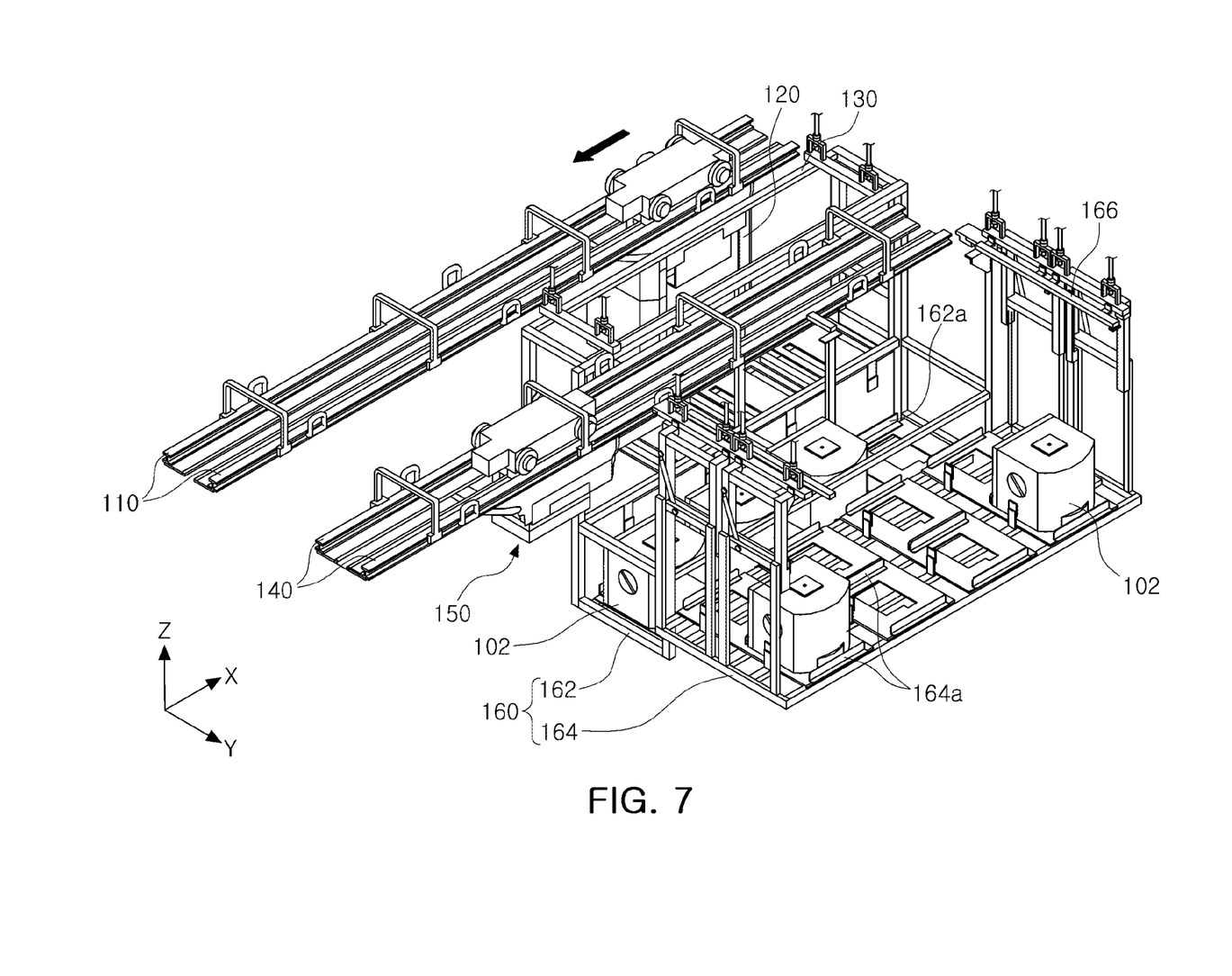
FIGS. 7 to 11 are views of an operation of a wafer storage system according to an example embodiment.

As shown in FIG. 7, the OHT 120 may move along the main rail 110 to transport the storage case 102, e.g., along the X-axis direction. In this case, the OHT 120 is disposed on one side of the interface port 130. The OHT 120 may move via the traveling unit 122 (e.g., which rolls via wheels on the main rail 110) along the main rail 110 until it reaches a predetermined position relative to the interface port 130, e.g., along the X-axis direction. For example, as illustrated in FIG. 7, the main rail 110 may be installed along, e.g., in parallel to, a top of the interface port 130.

Figure 8:
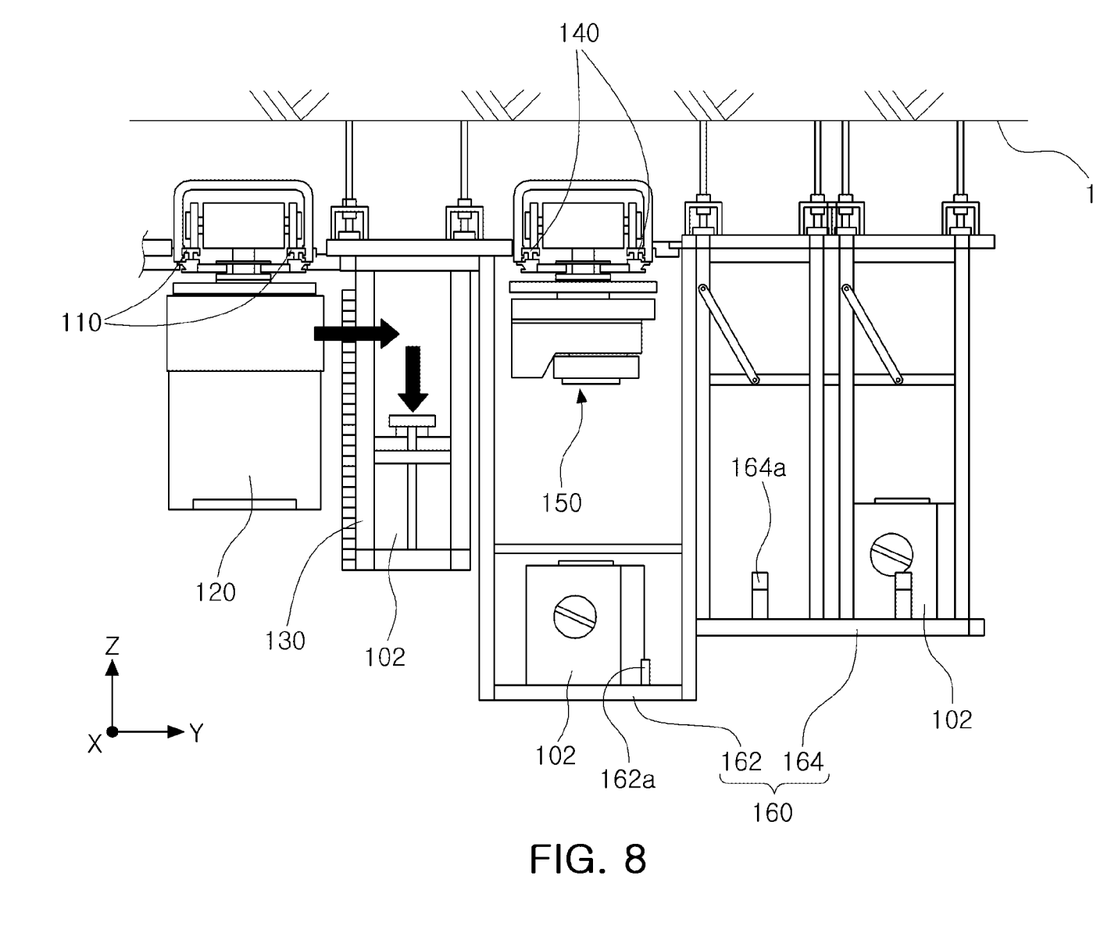

As shown in FIG. 8, the OHT 120 may transfer the storage case 102 to the interface port 130. For example, the OHT 120 (e.g., the grip unit 124 of the OHT 120) may move the storage case 102 toward the interface port 130 (e.g., along the Y-axis direction) and down toward the seating plate 132 of the interface port 130 (e.g., along the Z-axis direction).

Figure 9:
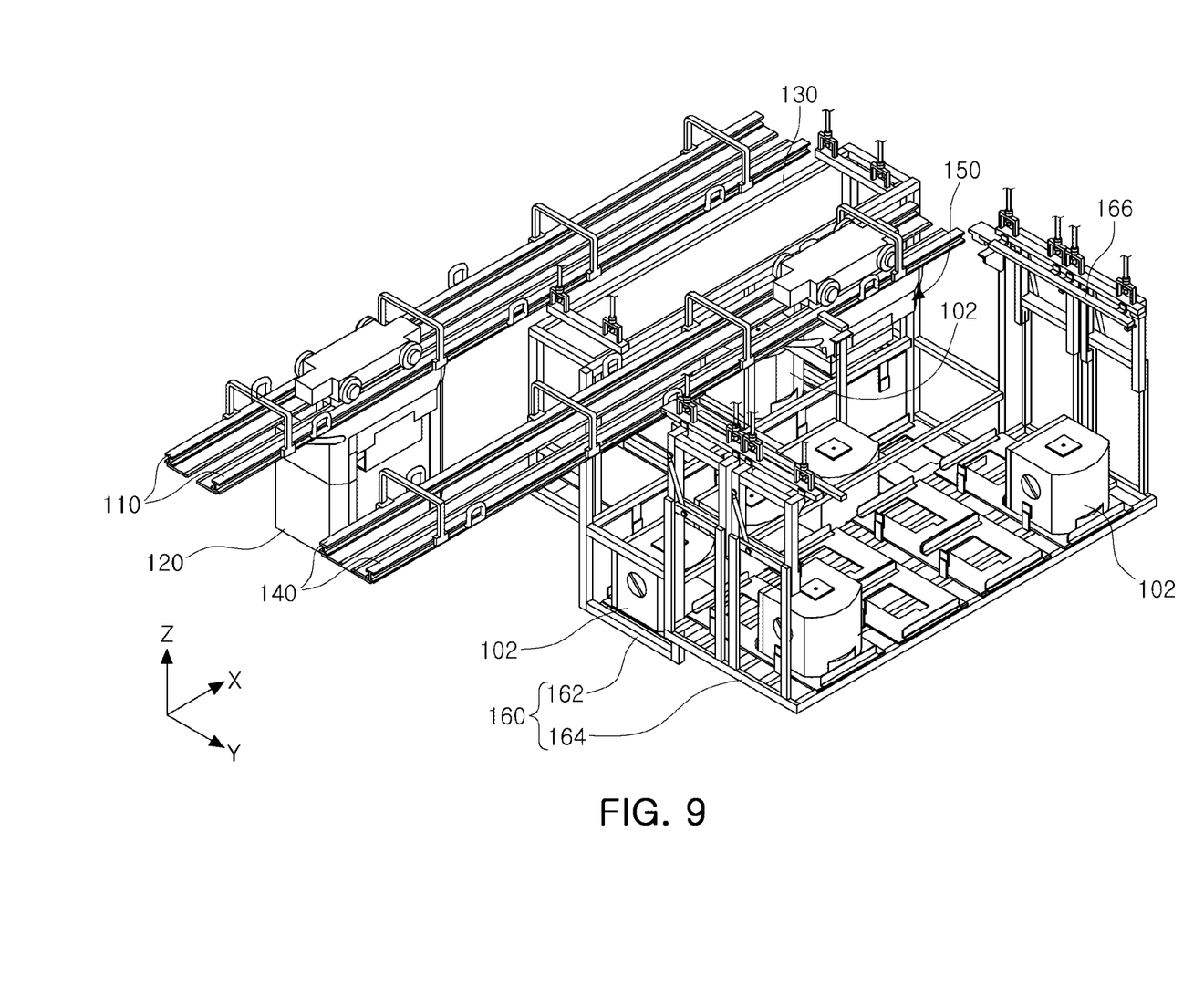

Referring to FIG. 9, when the storage case 102 is stored in the interface port 130, the auxiliary transfer unit 150 may move to one side of the interface port 130, e.g., along the auxiliary rail 140, to pick up the stored storage case 102.

Figure 10:
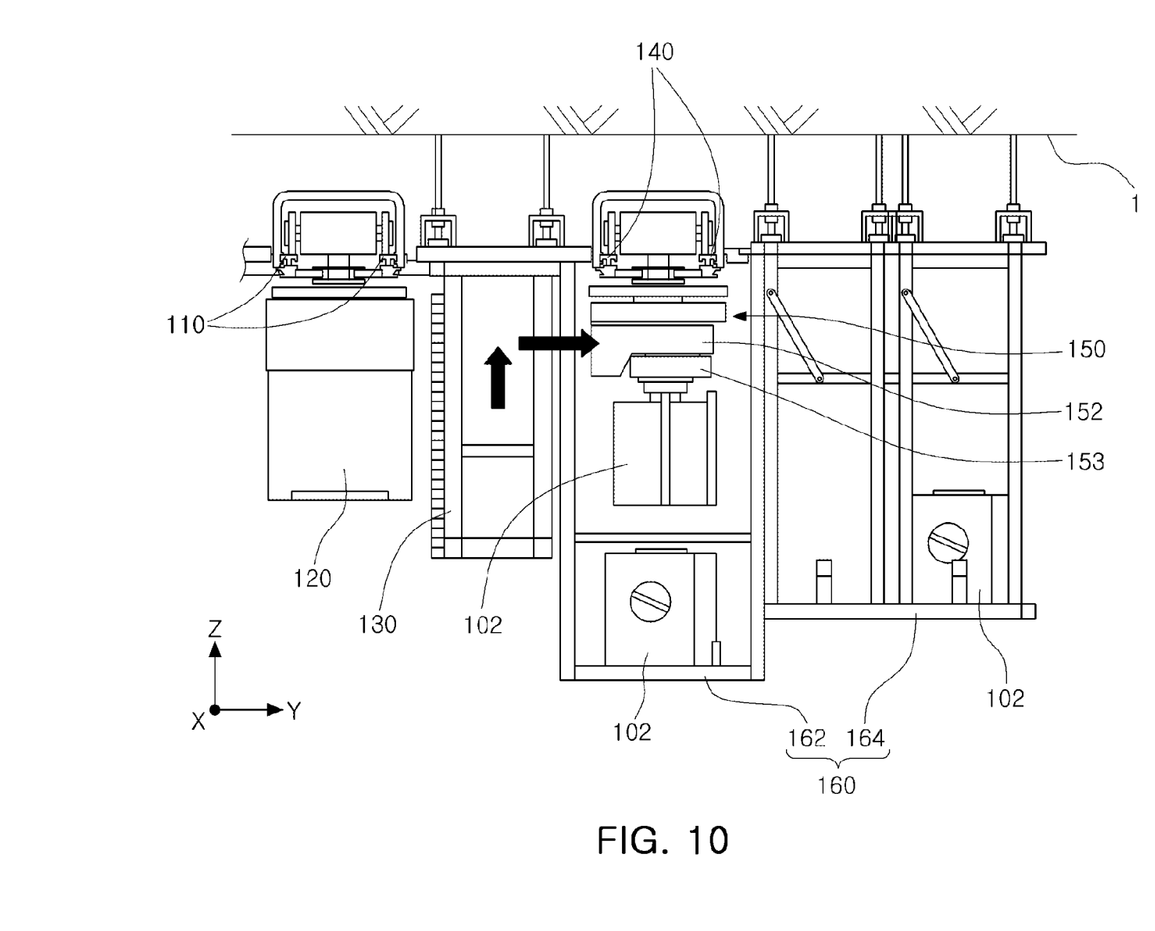

As shown in FIG. 10, the auxiliary transfer unit 150 may pick up the storage case 102 from the interface port 130 to transfer the storage case 102 to the storage shelf 160. For example, the auxiliary transfer unit 150 (e.g., the slider 152) may move toward the storage case 102 in the interface port 130 (e.g., along the Y-axis direction), and the grip unit 153 may move down to pick up the storage case 102 (e.g., along the Z-axis direction). Once the storage case 102 is picked up from the interface port 130, the slider 152 may move, e.g., along the Y-axis direction, toward the storage shelf 160.

Figure 11:
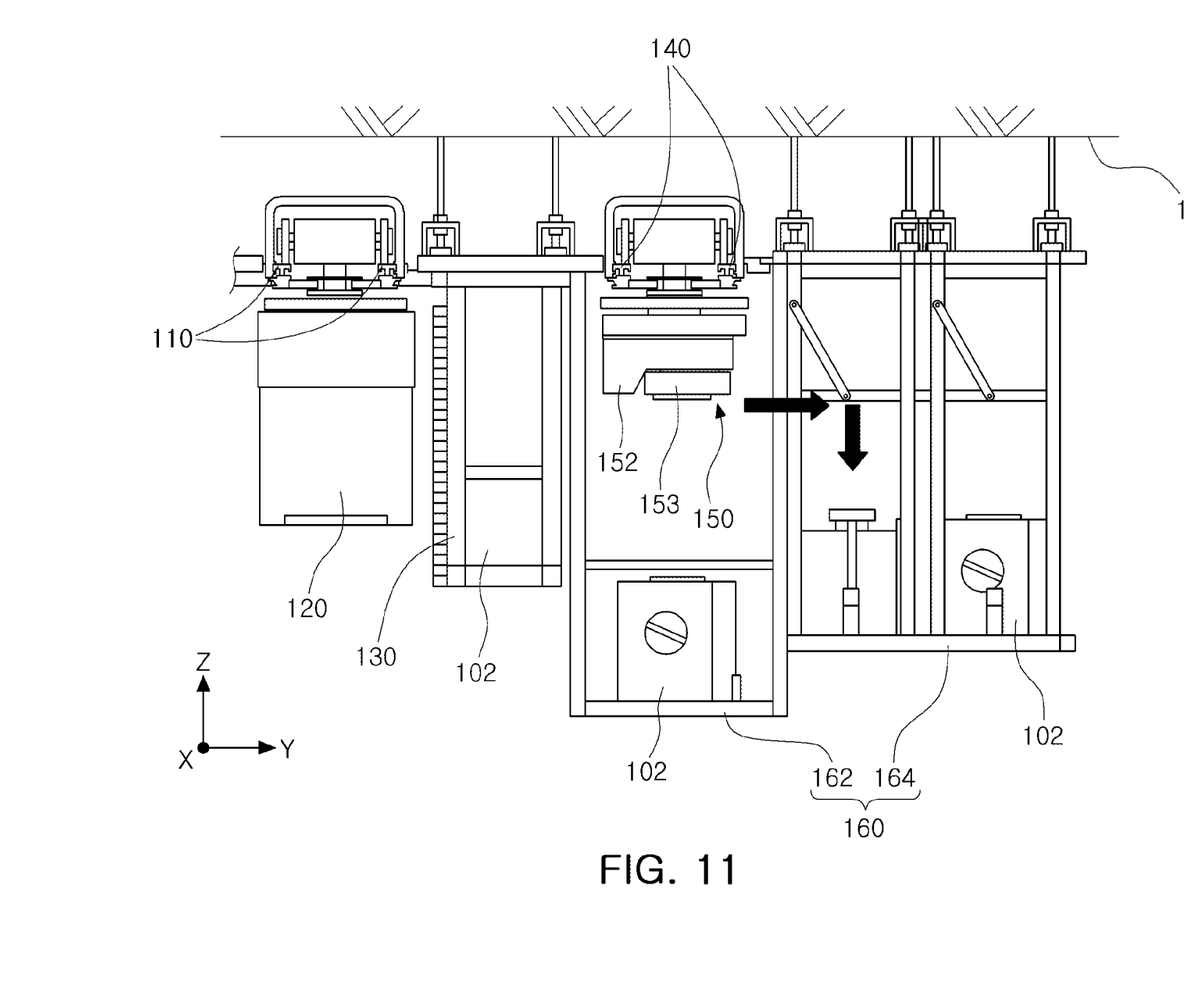

As shown in FIG. 11, the auxiliary transfer unit 150 may unload the storage case 102 (picked up from the interface port 130) down on the storage shelf 160. The grip unit 153 and the slider 152 may move in the Y-axis and Z-axis directions to place the storage case 102 on the storage shelf 160 in a similar way to the described previously with reference to FIG. 10.

Transferring of the storage case 102 from the storage shelf 160 is performed in a reverse order of the above method. In detail, the auxiliary transfer unit 150 may be moved along the auxiliary rail 140 to one side of the storage shelf 160, and the auxiliary transfer unit 150 may unload the storage case 102 stored in the storage shelf 160. Thereafter, the auxiliary transfer unit 150 may transfer the unloaded storage case 102 to the interface port 130, and the OHT 120 may move to one side of the interface port 130 to transfer the storage case 102 from the interface port 130 to a predetermined, e.g., desired, location.

By way of summation and review, attempts have been made to implement a stocker as a storage space in a semiconductor processing apparatus. However, implementation of the stocker as a storage space may interfere with a movement space of an operator. Further, a restriction that a side track buffer (STB), i.e., transported materials, should be disposed only in a space next to an OHT, may reduce an STB installation space.

Therefore, an aspect of the present disclosure is to provide a wafer storage system having increased storage space of wafer. That is, according to example embodiments, a wafer storage system may be installed in a free space of a semiconductor processing apparatus, e.g., by utilizing the empty space on the ceiling of the semiconductor processing apparatus, thereby allowing continuous maintenance and repair. In other words, a wafer storage system includes an increased wafer storage space through an interface port disposed adjacent to the rail for OHT, an auxiliary transfer unit (loader), and a maintenance unit.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A wafer storage system provided in a semiconductor factory, comprising:
   a main rail;
   an overhead hoist transport (OHT) on the main rail, the OHT being configured to transfer at least one storage case with wafers;
   an interface port on at least one side of the main rail;
   an auxiliary rail on one side of the interface port, the auxiliary rail being parallel to the main rail, and the interface port being between the main rail and the auxiliary rail;
   an auxiliary transport on the auxiliary rail, the auxiliary transport being configured to move along the auxiliary rail and to move the at least one storage case;
   a storage shelf on at least one side of the auxiliary transport, the storage shelf being configured to store the at least one storage case; and
   a worktable on one side of the storage shelf, the storage shelf being between the worktable and the auxiliary transport, the worktable including a frame, a plate attached to the frame, the plate being configured to support an operator, and a ladder connected to the plate;
   wherein the interface port, the auxiliary rail, the storage shelf, and the worktable are attached in a non-moveable manner to a ceiling surface of the semiconductor factory to maintain a fixed positional relationship to the ceiling surface.

2. The wafer storage system as claimed in claim 1, wherein the interface port includes an empty space, the empty space being configured to accommodate a plurality of storage cases.

3. The wafer storage system as claimed in claim 1, wherein the auxiliary transport is movable between the interface port and the storage shelf, the auxiliary transport being configured to move the at least one storage case between the interface port and the storage shelf.

4. The wafer storage system as claimed in claim 3, wherein the auxiliary transport includes:
   a traveling unit on the auxiliary rail, the traveling unit being configured to move along the auxiliary rail;
   a slider connected to the traveling unit, the slider being slidably movable between the interface port and the storage shelf along a direction intersecting the auxiliary rail; and
   a gripper below the slider, the gripper being moveable along a direction normal to the auxiliary rail to grip the storage case.

5. The wafer storage system as claimed in claim 4, wherein a movable distance of the slider in a direction intersecting the auxiliary rail is longer than a movable distance of the OHT in a direction intersecting the main rail.

6. The wafer storage system as claimed in claim 1, wherein the storage shelf includes a purge gas injection pipe to inject a purge gas.

7. The wafer storage system as claimed in claim 1, wherein the storage shelf includes:
   a first storage shelf on one side of the auxiliary transport; and
   a second storage shelf connected to the first storage shelf, the second storage shelf being below the auxiliary transport.

8. The wafer storage system as claimed in claim 7, wherein a width of the first storage shelf is at least twice a width of the second storage shelf, as measured along a direction intersecting the main rail.

9. The wafer storage system as claimed in claim 7, wherein the first storage shelf includes a first storage space configured to accommodate a plurality of rows and columns of storage cases, and the second storage shelf includes a second storage space configured to accommodate a single column of storage cases.

10. The wafer storage system as claimed in claim 1, wherein the frame of the worktable is attached to the ceiling surface of a semiconductor factory.

11. The wafer storage system as claimed in claim 1, wherein the interface port, the auxiliary transport, the storage shelf, and the worktable are sequentially disposed on one side or both sides of the OHT, with respect to the OHT.

12. The wafer storage system as claimed in claim 1, further comprising a controller connected to the OHT and the auxiliary transport, the controller being configured to control movement of the OHT and the auxiliary transport.

13. A wafer storage system provided in a semiconductor factory, comprising:
   a main rail;
   an overhead hoist transport (OHT) on the main rail, the OHT being configured to transfer at least one storage case with wafers;
   an interface port on at least one side of the main rail;
   an auxiliary rail on one side of the interface port;
   an auxiliary transport on the auxiliary rail, the auxiliary transport being configured to move along the auxiliary rail;
   a storage shelf on at least one side of the auxiliary transport, the storage shelf being configured to store the at least one storage case, and the storage shelf including:
      a first storage shelf on one side of the auxiliary transport, and
      a second storage shelf connected to the first storage shelf, the second storage shelf being below the auxiliary transport, and the auxiliary transport being configured to transfer the at least one storage case between the interface port and at least one of the first storage shelf and the second storage shelf, and
   a worktable on one side of the storage shelf, the worktable including a frame, a plate attached to the frame, the plate being configured to support an operator, and a ladder connected to the plate,
   wherein the interface port, the auxiliary rail, the first storage shelf, the second storage shelf and the worktable are attached in a non-moveable manner to a ceiling surface of the semiconductor factory, and
   wherein the first storage shelf is disposed directly adjacent to the worktable and between the worktable and the auxiliary transport to maintain a fixed positional relationship to the ceiling surface.

14. The wafer storage system as claimed in claim 13, wherein the interface port, the auxiliary transport, the first storage shelf, and the worktable are sequentially disposed on one side or both sides of the OHT, with respect to the OHT.

15. The wafer storage system as claimed in claim 13, further comprising a controller connected to the OHT and the auxiliary transport, the controller being configured to control movement of the OHT and the auxiliary transport.

* * * * *